(12) United States Patent
Kajita et al.

(10) Patent No.: US 11,879,049 B2
(45) Date of Patent: Jan. 23, 2024

(54) ORGANIC INSULATING BODY, METAL-CLAD LAMINATE, AND WIRING BOARD

(71) Applicant: KYOCERA Corporation, Kyoto (JP)

(72) Inventors: Satoshi Kajita, Ikoma (JP); Yasuhide Tami, Aira (JP)

(73) Assignee: KYOCERA CORPORATION, Kyoto (JP)

( * ) Notice: Subject to any disclaimer, the term of this patent is extended or adjusted under 35 U.S.C. 154(b) by 163 days.

(21) Appl. No.: 17/293,264

(22) PCT Filed: Nov. 15, 2018

(86) PCT No.: PCT/JP2018/042312
§ 371 (c)(1),
(2) Date: May 12, 2021

(87) PCT Pub. No.: WO2020/100259
PCT Pub. Date: May 22, 2020

(65) Prior Publication Data
US 2022/0002522 A1 Jan. 6, 2022

(51) Int. Cl.
B32B 3/10 (2006.01)
C08K 13/02 (2006.01)
(Continued)

(52) U.S. Cl.
CPC ............ C08K 13/02 (2013.01); B32B 15/08 (2013.01); B32B 27/20 (2013.01); C08L 45/00 (2013.01); C09K 21/08 (2013.01); H01B 3/002 (2013.01); H01B 3/307 (2013.01); H05K 1/0373 (2013.01); B32B 2307/3065 (2013.01); B32B 2457/08 (2013.01); C08K 3/36 (2013.01); C08K 5/03 (2013.01); C08K 5/14 (2013.01);
(Continued)

(58) Field of Classification Search
None
See application file for complete search history.

(56) References Cited

U.S. PATENT DOCUMENTS

2004/0018348 A1   1/2004   Saito
2008/0105454 A1   5/2008   Morioka et al.
(Continued)

FOREIGN PATENT DOCUMENTS

CN   110741445 A   1/2020
EP   1930371 A1   6/2008
(Continued)

Primary Examiner — Christopher M Polley
(74) Attorney, Agent, or Firm — Volpe Koenig

(57) ABSTRACT

A flame retardant is included in a resin phase, and the flame retardant has a maximum number frequency in a range of 1 μm or less when a particle size distribution is evaluated by dividing a particle size into 1 μm increments. The resin phase includes inorganic particles, and the inorganic particles have a maximum number frequency in a range of 0.5 μm or less when the particle size distribution is evaluated by dividing the particle size into 0.5 μm increments. The flame retardant has an average particle size larger than the average particle size of inorganic particles. The number frequency of the flame retardant and the inorganic particles, respectively, decreases with increasing the particle size.

8 Claims, 3 Drawing Sheets

(51) Int. Cl.
  *B32B 15/08*    (2006.01)
  *B32B 27/20*    (2006.01)
  *C08L 45/00*    (2006.01)
  *C09K 21/08*    (2006.01)
  *H01B 3/00*     (2006.01)
  *H01B 3/30*     (2006.01)
  *H05K 1/03*     (2006.01)
  *C08K 3/36*     (2006.01)
  *C08K 5/03*     (2006.01)
  *C08K 5/14*     (2006.01)

(52) U.S. Cl.
  CPC .... *C08K 2201/005* (2013.01); *C08L 2201/02* (2013.01); *C08L 2203/30* (2013.01); *C08L 2205/025* (2013.01); *H05K 2201/012* (2013.01); *H05K 2201/0129* (2013.01); *H05K 2201/0158* (2013.01); *H05K 2201/0209* (2013.01); *H05K 2201/0266* (2013.01)

(56) References Cited

U.S. PATENT DOCUMENTS

| | | | |
|---|---|---|---|
| 2019/0014661 A1* | 1/2019 | Inoue | H05K 1/0353 |
| 2020/0077514 A1* | 3/2020 | Nagasawa | B32B 5/022 |
| 2020/0115572 A1* | 4/2020 | Liu | H05K 3/285 |
| 2020/0128667 A1 | 4/2020 | Nagasawa et al. | |

FOREIGN PATENT DOCUMENTS

| | | | | |
|---|---|---|---|---|
| JP | 2003-238761 A | 8/2003 | | |
| JP | 2004-063718 A | 2/2004 | | |
| JP | 2007-002036 A | 1/2007 | | |
| JP | 2009-088237 A | 4/2009 | | |
| JP | 2010-100843 A | 5/2010 | | |
| JP | 2017-157787 A | 9/2017 | | |
| JP | 2018-035257 A | 3/2018 | | |
| WO | 2005/013291 A1 | 2/2005 | | |
| WO | 2009/038177 A1 | 3/2009 | | |
| WO | 2017/130760 A1 | 8/2017 | | |
| WO | WO-2017130760 A1 * | 8/2017 | | B32B 15/08 |
| WO | 2018/016527 A1 | 1/2018 | | |

* cited by examiner

ORGANIC INSULATING BODY, METAL-CLAD LAMINATE, AND WIRING BOARD

TECHNICAL FIELD

The present disclosure relates to an organic insulating body, a metal-clad laminate, and a wiring board.

BACKGROUND ART

In recent years, the speed and integration of LSIs and the memory capacity have increased. As a result, the various electronic components have been rapidly reduced in size, weight, and thickness. Conventionally, a metal-clad laminate in which a copper foil is bonded to the surface of an organic insulating body, for example, have been used as a wiring board used in used in the field of such electronic components.

PRIOR ART DOCUMENTS

Patent Documents

Patent Document 1: Japanese Unexamined Patent Publication No. 2010-100843

SUMMARY

An organic insulating body of the present disclosure includes a flame retardant in a resin phase, and the flame retardant has a maximum number frequency in a range of 1 μm or less when a particle size distribution is evaluated by dividing a particle size into 1 μm increments.

A metal-clad laminate of the present disclosure includes the organic insulating body described above and a metal foil laminated on at least one side of the organic insulating body.

A wiring board of the present disclosure includes a plurality of insulating layers and a metal foil disposed between the insulating layers, in which the insulating layers are composed of the organic insulating bodies described above.

EMBODIMENTS FOR CARRYING OUT THE INVENTION

A metal-clad laminate having a metal foil on a surface of an organic insulating body is applied to a wiring board for high frequency applications. In such a case, it is required to reduce a surface roughness of the metal foil. However, if the surface roughness of the metal foil is reduced, the adhesion strength between the metal foil and the organic insulating body is reduced.

Figure 1:
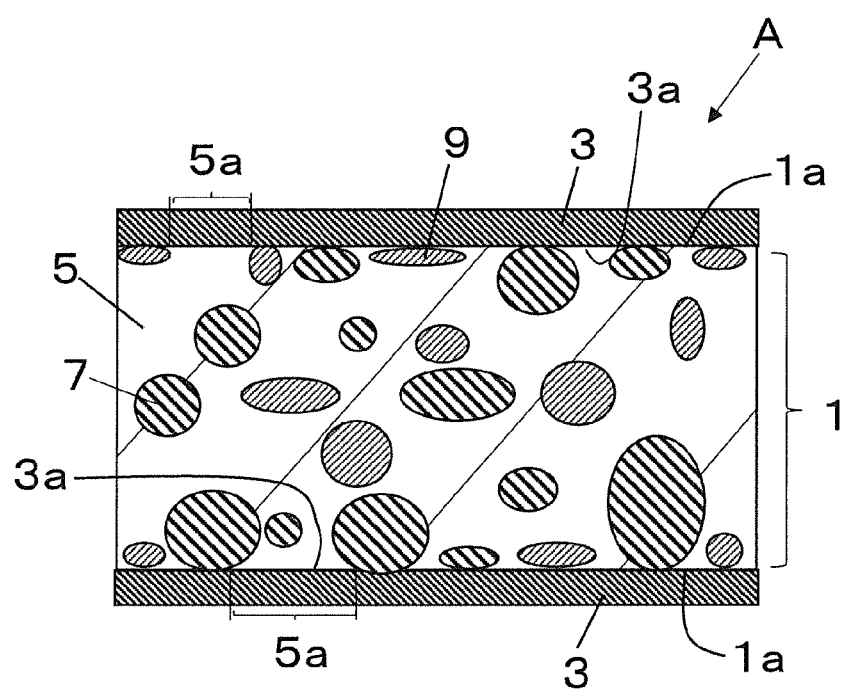
FIG. 1 is a sectional view schematically illustrating one embodiment of a metal-clad laminate.
Figure 2:
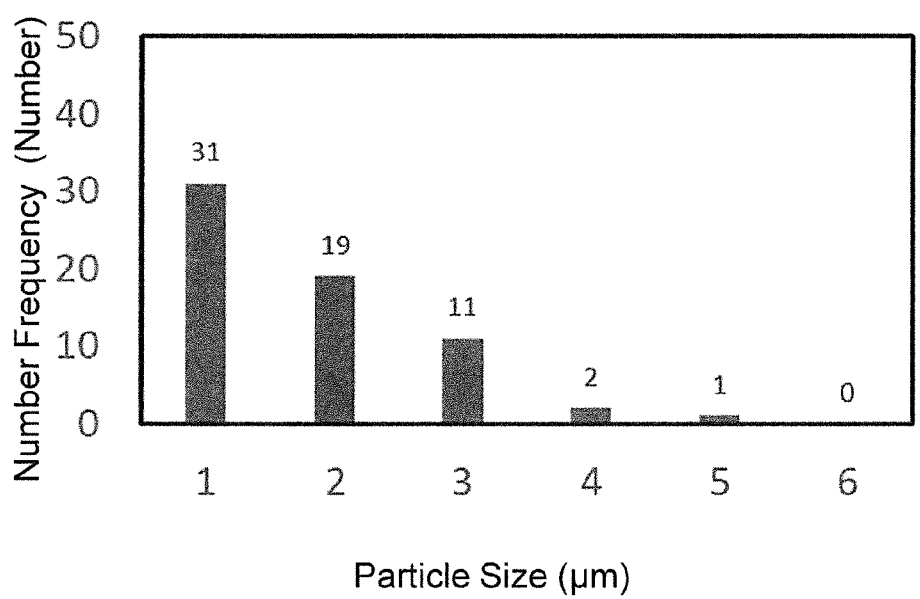
FIG. 2 is a graph illustrating an example of a particle size distribution of flame retardant.
Figure 3:
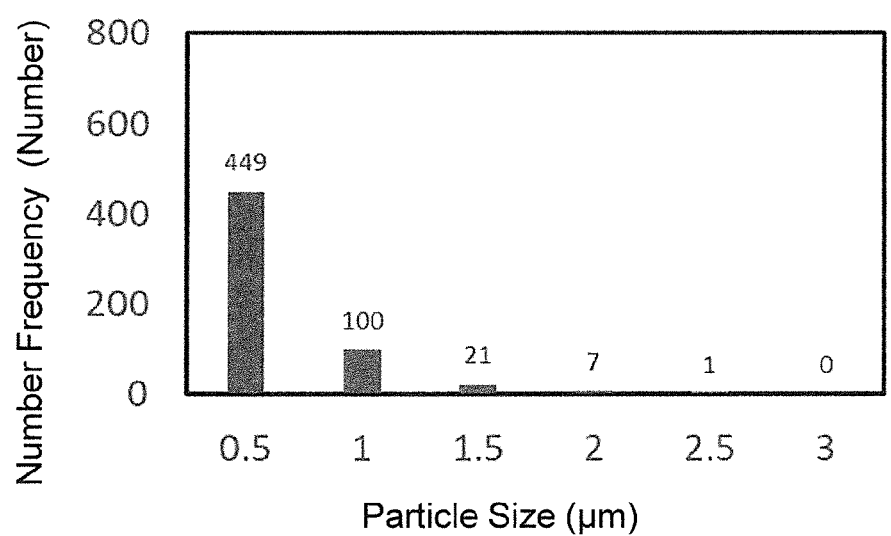
FIG. 3 is a graph illustrating an example of a particle size distribution of inorganic particles.

FIG. 1 is a sectional view schematically illustrating one embodiment of a metal-clad laminate. FIG. 2 is a graph illustrating an example of a particle size distribution of flame retardant. FIG. 3 is a graph illustrating an example of a particle size distribution of inorganic particles.

A metal-clad laminate A includes a metal foil 3 on a surface 1a of an organic insulating body 1. The organic insulating body 1 includes a flame retardant 7 in a resin phase 5. The flame retardant 7 includes the following particle size distribution and is dispersed in the resin phase 5. The resin phase 5 has a structure of a whole connected medium. In other words, the resin phase 5 is a part which is a matrix phase in the organic insulating body 1.

The organic insulating body 1 has the maximum number frequency in the range of 1 μm or less, where the particle size distribution is evaluated by dividing the particle size of the flame retardant 7 into intervals of 1 μm. Evaluating by dividing the particle size into intervals of 1 μm means that the evaluation is done by dividing the intervals into particles where a particle size is in a range of greater than 0 μm and 1 μm or less, and particles where a particle size is in the range of greater than 1 μm and 2 μm or less. In this case, a ratio of particles in the range of particle size greater than 0 μm and 1 μm or less is preferably 40% or more in terms of number ratio. In particular, 45% or more and 60% or less is preferred.

The particle size distribution of the flame retardant 7 illustrated in FIG. 2 represents the particle size of the flame retardant 7 divided into intervals of 1 μm. A numerical value of the particle size on the horizontal axis of the graph illustrated in FIG. 2 represents the maximum value in each range. For example, the numerical value of the number frequency shown in a section labeled as 1 μm in particle size is the number frequency of particles with a particle size greater than 0 μm and 1 μm or less, and the others also have similar meaning.

If a large number of flame retardants 7 with a particle size of 1 μm or less are included in the resin phase 5, a number of structures in which the flame retardants 7 are finely divided by the resin phase 5 are formed on the surface 1a of the organic insulating body 1. This means that because the size of the flame retardant 7 is smaller, the surface 1a of the organic insulating body 1 where the metal foil 3 is bonded has a smaller area occupied by the individual flame retardants 7. The surface 1a of the organic insulating body 1 has many parts where the resin phase 5 becomes finer and exposed in a region where the flame retardant 7 is exposed. In FIG. 1, a part where the resin phase 5 is exposed in the region where the flame retardant 7 is exposed is represented as a resin-exposed part 5a. The surface 3a of the metal foil 3 in contact with the organic insulating body 1 is usually treated with a roughening process. Therefore, it has a predetermined surface roughness (Ra), as described below. The surface 3a of the metal foil 3 is a concavo-convex shape. The resin phase 5, which is small in size and exists in the region where the flame retardant 7 is exposed, can easily adhere to the concavo-convex part of the surface 3a of the metal foil 3. When the size of the resin phase 5 is small, if a peripheral part of the flame retardant 7 is in a concavo-convex shape, a resin layer 5 can enter a gap part of the concavo-convex shape. This makes it possible for the flame retardant 7 to also adhere to the metal foil 3. Therefore, even if the organic insulating body 1 includes a large number of flame retardants 7, the metal foil 3 can easily adhere to the resin phase 5 adjacent to the flame retardant 7. The adhesion strength of the metal foil 3 can be increased. In addition, the organic insulating body 1 can be made less flammable when a combustion test is conducted on it.

When the particle size distribution of the flame retardant 7 is evaluated, if the position of the particle size where the number frequency is the maximum is in a range larger than 1 μm or the number frequency is in the range other than the minimum and maximum value sections of the evaluated particle size range, the adhesion strength of the metal foil may become poor and the flame retardance of the organic insulating body 1 may decrease.

When the flame retardant 7 having a particle size larger than 1 μm is included in the organic insulating body 1, the flame retardance of the organic insulating body 1 can be reduced compared to the case where the flame retardant 7 having a particle size larger than 1 μm is not included.

The number frequency is a value that evaluates the number of flame retardants 7 existing in the organic insulating body 1. The following method is used to determine the number of flame retardants 7 for the organic insulating body 1. First, a cross-section is arbitrarily exposed from the organic insulating body 1. Next, the flame retardant 7 is identified from the exposed cross-section, a range of predetermined area is defined, and the number of flame retardants 7 existing in that range is counted. The area used to evaluate the number is preferably in a range of 200 μm² or more and 1000 μm² or less.

To identify the flame retardant 7 from the cross-section of the organic insulating body 1, a scanning electron microscope attached with an energy dispersive X-ray analyzer can be used. The flame retardant 7 found in the cross-section of the organic insulating body 1 is usually different in color tone from the resin phase 5. To identify a clump in the organic insulating body 1 as the flame retardant 7, when the clump is analyzed, bromine (Br) detected in the clump is determined as the flame retardant 7. In this case, several clumps found in the cross-section of the organic insulating body 1 may be analyzed first to certify the color tone of the clumps identified as the flame retardant 7, and then the method of counting the clumps with the same color tone may be adopted.

For the flame retardant 7, the compounds shown below are suitable. Examples include melamine phosphate, melam polyphosphate, melem polyphosphate, melamine pyrophosphate, ammonium polyphosphate, red phosphorus, aromatic phosphate ester, and brominated flame retardant (for example, ethylene bis-pentabromobenzene, ethylene bis-tetrabromophthalimide, and the like). These flame retardants may be used alone or in combination with two or more. The flame retardant 7 is preferably included in a ratio of 15 parts by mass or more and 45 parts by mass or less, if the content of the resin phase 5 is 100 parts by mass. By including the flame retardant 7 in such a ratio, the effects on dielectric dissipation factor, adhesion, and moisture resistance can be minimized, while the flame resistance and heat resistance can be further improved.

The organic insulating body 1 may also include the inorganic particles 9. The inorganic particles 9 are preferred to have the following particle size distribution and to be dispersed in the resin phase 5. The inorganic particles 9 have the maximum number frequency in a range of 0.5 μm or less, where the particle size distribution is evaluated by dividing the particle size into intervals of 0.5 μm. Evaluating by dividing the particle size into intervals of 0.5 μm means that the evaluation is done by dividing the intervals into particles where a particle size is in a range of greater than 0 μm and 0.5 μm or less, and particles where a particle size is in the range of greater than 0.5 μm and 1 μm or less.

The particle size distribution of the inorganic particles 9 illustrated in FIG. 3 represents the particle size of the inorganic particles 9 divided into intervals of 0.5 μm. The numerical value of the particle size on the horizontal axis of the graph illustrated in FIG. 3 represents the maximum value in each range. For example, the numerical value of the number frequency shown in a section labeled as 0.5 μm in particle size is the number frequency of particles with a particle size greater than 0 μm and 0.5 μm or less, and the others have the similar meaning. The reason why the particle size distribution of the inorganic particles 9 is divided every 0.5 μm is to take into account that if the particle size is divided every 1 μm, like the flame retardant 7, the number frequency in the range of 1 μm or less becomes the majority, and a tendency of the particle size distribution becomes less apparent.

If a large number of inorganic particles 9 with a particle size of 0.5 μm or less are included as the inorganic particles 9 in the resin phase 5, many structures are formed in the organic insulating body 1 where the inorganic particles 9 finely divide the resin phase 5. This means that the size of the region where the inorganic particles 9 are locally agglomerated is reduced. Therefore, the surface 1a of the organic insulating body 1 where the metal foil 3 is bonded has a smaller area occupied by the individual inorganic particles 9 in addition to the flame retardant 7. The surface 1a of the organic insulating body 1 becomes a state where the resin phase 5 is exposed in the region where the inorganic particles 9 are exposed. In FIG. 1, the part where the resin phase 5 is exposed in the region where the inorganic particles 9 are exposed is represented as the resin-exposed part 5a.

In the organic insulating body 1, the resin phase 5, which is small in size and exists in the region where the inorganic particles 9 are exposed, easily adheres to the concavo-convex part of surface 3a of the metal foil 3. When the size of the resin phase 5 is small, if the surface of the inorganic particles 9 is in a concavo-convex shape, the resin layer 5 can enter a gap part of the concavo-convex shape. This makes it possible for the inorganic particles 9 to also adhere to the metal foil 3. Therefore, even if the organic insulating body 1 includes a large number of inorganic particles 9, the metal foil 3 can easily adhere to the resin phase 5 adjacent to the inorganic particles 9. The decrease in the adhesion strength of the metal foil 3 can be suppressed. In addition, the variation in adhesion strength can be reduced. Furthermore, when a combustion test of the organic insulating body 1 is conducted, the variation in the flame retardance of the organic insulating body 1 can be reduced. In this case, a ratio of particles in the range of particle size greater than 0 μm and 0.5 μm or less is preferably 60% or more in terms of number ratio. In particular, 70% or more and 90% or less is preferred.

The method for examining the number of inorganic particles 9 included in the organic insulating body 1 is similar to that for the flame retardant 7. The inorganic particles 9 found in the cross-section of the organic insulating body 1 are also usually different in color tone from the resin phase 5. To identify clumps existing in the organic insulating body 1 as the inorganic particles 9, when the clumps are analyzed, elements other than carbon (C), phosphorus (P), and bromine (Br), as listed below, are detected in the clumps and are judged to be the inorganic particles 9. Elements other than carbon (C) and bromine (Br) are at least one element selected from the group of aluminum (Al), silicon (Si), zinc (Zn), titanium (Ti), and each of alkaline earth elements (Mg, Ca, Sr, Ba).

For the organic insulating body 1, it is preferred that the respective number frequencies of flame retardant 7 and inorganic particles 9 show a tendency to decrease with increasing particle size when divided in 1 μm and 0.5 μm, as described above. If the number frequency of each of the flame retardant 7 and inorganic particles 9 tends to decrease as the particle size increases, it is easier to maintain the structure that finely divides the resin phase 5 even if the number of flame retardant 7 and inorganic particles included in the organic insulating body 1 increases.

The range of the particle size of the flame retardant 7 is preferably 0.06 μm or more and 6 μm or less. The range of the particle size of the inorganic particles 9 is preferably 0.04 μm or more and 3.6 μm or less. Furthermore, the average particle size of the flame retardant 7 is preferably larger than the average particle size of the inorganic particles 9. In other words, it is preferred that the average particle size of the inorganic particles 9 is smaller than the average particle size of the flame retardant 7. If the average particle size of the inorganic particles 9 is smaller than the average particle size of the flame retardant 7, the inorganic particles 9 with a smaller particle size can easily enter the resin phase 5 where the flame retardant 7 is adjacent to it. This can further increase the adhesion strength and flame retardance between the organic insulating body 1 and the metal foil 3.

The individual particle size and the average particle size of the flame retardant 7 and the individual particle size and the average particle size of the inorganic particles 9 are also determined using the cross-sectional photographs for which the number frequencies of the flame retardant 7 and the inorganic particles 9 are determined as described above. The particle size of the flame retardant 7 and the inorganic particles 9 are the particle size in the cross-section of the organic insulating body 1.

Specifically, the respective contours of the clumps identified as the flame retardant 7 and the inorganic particles 9, respectively, are taken, and then the contours are converted into the area of a circle by image analysis. Next, the diameter is obtained from the area of the resulting circle. In addition, the average value is obtained from the individually obtained diameters.

As the inorganic particles 9, the metal oxides shown below are suitable. Examples include at least one type selected from the group of silica, talc, mica, clay, titanium dioxide, barium titanate, glass beads, glass hollow spheres, or the like. In addition to metal oxides, carbonates such as calcium carbonate can also be used.

A preferable material for the resin phase 5 is cyclic olefin copolymer as its main component, which includes peroxide. The peroxide is preferred to have a benzene ring. For the organic insulating body 1, thermosetting organic compounds are preferred. As for such organic compounds, it is preferred to use cyclic olefin copolymer as the main component. By applying a material composed mainly of cyclic olefin copolymer having thermosetting properties to the resin phase 5, it is possible to obtain an organic insulating body having small temperature dependence and low relative permittivity and dielectric dissipation factor in a high frequency region. The dielectric properties are, for example, a relative permittivity of 2.7 or less and a dielectric dissipation factor of 0.002 or less for 30 GHz at 125° C.

For the cyclic olefin copolymer having thermosetting properties, it is preferable to have functional groups that can be cross-linked within a molecule. In this case, at least one type selected from the group of vinyl groups, allyl groups, acrylic groups, and methacrylic groups can be mentioned as a cross-linkable functional group.

Peroxides having a benzene ring include, for example, t-butyl peroxy benzoate, α, α'-di-(t-butyl peroxy) diisopropyl benzene, t-butyl cumyl peroxide, and dicumyl peroxide.

When the resin phase 5 is formed by the cyclic olefin copolymer, it is preferable to use a thermosetting cyclic olefin copolymer (thermosetting COC) as the main component in terms of heat resistance. However, it can be a composite with a thermoplastic cyclic olefin copolymer (thermoplastic COC) if it includes more than a predetermined ratio of thermosetting cyclic olefin copolymer as the main component of the organic insulating body 1. Here, the main component is the one with the highest volume fraction among the resin components included in the resin layer 5.

If the resin phase 5 is the composite of the thermosetting cyclic olefin copolymer and the thermoplastic cyclic olefin copolymer, the peak of loss tangent obtained by dynamic viscoelasticity measurement exists in two temperature regions at a temperature of 120° C. or more and 150° C. or less and at a temperature of 80° C. or more and 100° C. or less.

If the resin phase 5 is the composite of the thermosetting cyclic olefin copolymer and the thermoplastic cyclic olefin copolymer, the relative permittivity and the dielectric dissipation factor of the organic insulating body 1 can be further reduced compared to the case where the cyclic olefin copolymer is the thermosetting cyclic olefin copolymer. In this case, the dielectric properties of the organic insulating body 1 are a relative permittivity of 2.69 or less at 30 GHz and a dielectric dissipation factor of 0.0019 or less. The content of the thermosetting cyclic olefin copolymer in the composite is preferably 60% by mass or more and 80% by mass or less. The content of the thermoplastic cyclic olefin copolymer in the composite is preferably 20% by mass or more and 40% by mass or less.

The organic insulating body 1 may include additives such as stress relievers, antioxidants, heat stabilizers, antistatic agents, plasticizers, pigments, dyes, and colorants, as needed, to the extent that they do not interfere with the effectiveness of the organic insulating body 1.

The method of mixing each component when preparing the organic insulating body 1 is not particularly limited. The mixing method includes, for example, the solution mixing method in which all components are uniformly dissolved or dispersed in a solvent, and the melt blending method in which the components are heated by an extruder.

Xylene, for example, is a suitable solvent used in the solution mixing method. In this case, the mass ratio of solid content (resin) to solvent is not particularly limited, but for example, it is preferably 60:40 to 20:80. In addition to xylene, aromatic solvents such as toluene, benzene, and ethylbenzene, hydrocarbon solvents such as normal hexane, cyclohexane, and methylcyclohexane, ketone solvents such as acetone, and other solvents such as tetrahydrofuran and chloroform may be used, and xylene may be used in combination with the other solvents listed above.

The metal foil 3 is not particularly limited, and includes, for example, copper foils such as electrolytic copper foils and rolled copper foils, aluminum foils, and composite foils made by overlapping these metal foils. Among these metal foils 3, for example, copper foil is the most suitable. The thickness of the metal foil 3 is not limited, and for example, it is preferred to be approximately 5 to 105 μm.

The organic insulating body 1 of the present disclosure is suitable if the surface roughness Ra of the metal foil 3 is small. The surface roughness Ra of the metal foil 3, for example, is preferred to be 0.5 μm or less, especially 0.2 μm or less. The surface roughness (Ra) is preferred to be at least 0.05 μm or more for the reason of ensuring the adhesion strength between the metal foil 3 and the organic insulating body 1.

A metal-clad laminate A is obtained by overlapping the desired number of sheets of organic insulating body 1 and metal foil 3, respectively, and then heating and press-molding them. If the dielectric dissipation factor of the metal-clad laminate A is, for example, 0.0017 or less, it can be used for, for example, wiring boards for high-frequency application or the like because it exhibits sufficient electrical characteristics such as relative permittivity.

The wiring board includes a plurality of insulating layers and conductors layer disposed between the insulating layers, and the insulating layers are composed of the organic insulating body 1 described above. The wiring board can be similarly applied to a wiring board having a cavity structure as well as a multilayer wiring board in which insulation layers and conductor layers are alternately multilayered.

The wiring board can also be obtained, for example, by overlapping an inner layer board in which circuits and through-holes are formed on the metal-clad laminate of the present disclosure with prepreg, laminating a metal foil on the surface of the prepreg, and then heating (curing) and press-molding it. In addition, it may be used as a multilayer printed wiring board by forming circuits and through-holes on the surface of the metal foil. The insulating layer (organic insulating body) that constitutes the wiring board is mainly made of cyclic olefin polymer, and it is preferable that phenyl groups are detected by infrared spectroscopic analysis.

The wiring board applies the organic insulating body 1 described above to the insulating layer, therefore, the metal foil has high adhesion strength and high flame resistance.

Such a wiring board can be obtained, for example, through the steps of: preparing a resin composition that becomes the organic insulating body described above; forming a semi-cured insulating sheet by molding it into a sheet shape from the resin composition; attaching the metal foil that becomes the conductor layer to the surface of the insulating sheet; and heating and pressurizing the insulating sheet on which the metal foil is attached under predetermined conditions (temperature, pressure, and atmosphere).

EXAMPLES

Hereafter, the above embodiment is explained in detail with examples. The embodiment is not limited to these examples. Components used in the examples and comparative examples are as follows.

(Cyclic Olefin Copolymer (COC))

Thermosetting COC: Cyclic olefin copolymer having cross-linkable functional groups (manufactured by Mitsui Chemicals, Inc.)

Thermoplastic COC: Cyclic olefin copolymer not having cross-linkable functional groups (manufactured by Mitsui Chemicals, Inc.)

(Peroxides Containing Benzene Rings)

Perbutyl D: di-t-butyl peroxide (manufactured by NOF Corporation, without benzene ring)

(Other Additives)

Silica was used as the inorganic particles. Brominated ethylene bis-pentabromobenzene was used as the flame retardant. The particle size range, average particle size, and tendency of particle size distribution of the flame retardant and inorganic particles are shown in Table 1. The copper foil was used as the metal foil. The surface roughness (Ra) of the copper foil is shown in Table 1.

The resin phase was composed of 1.8 parts by mass of Perbutyl D (peroxide) added to 100 parts by mass of the cyclic olefin copolymer (COC).

The cyclic olefin copolymer (COC) was composed of 70 parts by mass of thermosetting COC and 30 parts by mass of thermoplastic COC.

The flame retardant was added at a rate of 30 parts by mass to 100 parts by mass of the cyclic olefin copolymer (COC). "SAYTEX8010 (manufactured by Albemarle Corporation)" was used as the flame retardant. The inorganic particles were added at a rate of 20 parts by mass to 100 parts by mass of the cyclic olefin copolymer (COC). Two kinds of flame retardants having different particle size ranges and tendencies of particle size distribution were prepared. Two kinds of inorganic particles having different particle size ranges and tendencies of particle size distribution were also prepared. Sample No. 1 and Sample No. 2 shown in Table 1 are obtained by using flame retardants and inorganic particles showing the particle size distributions shown in FIGS. 2 and 3. In other words, Sample No. 1 and Sample No. 2 show a tendency for the number frequency of flame retardants and inorganic particles to decrease with increasing the particle size when evaluated by dividing the particle size into each predetermined range. In Table 1, those showing a tendency for the number frequency to decrease with increasing the particle size are labeled Type 1.

On the other hand, Sample No. 3 and Sample No. 4, whose tendency of the particle size distribution is mountain-shaped, show the tendency that the maximum value of the number frequency exists in the central region excluding the smallest and largest sections in the measured particle size range. In Table 1, those showing a tendency for the maximum value of the number frequency to exist in the central region of the measured particle size range, excluding the smallest and largest sections, are labeled Type 2.

Next, each of the prepared components was mixed in the ratio described above and stirred at room temperature (25° C.) to obtain the resin composition. The particle size range, average particle size and tendency of particle size distribution of flame retardants and inorganic particles are shown in Table 1.

The resulting resin composition was then dissolved in xylene to obtain a resin varnish. The mass ratio of the resin composition to xylene was 40:60. The resulting resin varnish was then molded into a sheet shape using a bar coater and dried at 150° C. for 4 minutes to obtain a sheet-like molded body having a thickness of 15 μm.

Next, the resulting sheet-like molded body was cut into small pieces and laminated in eight overlapping sheets, and copper foil having a thickness of 18 μm was laminated on both surfaces. The copper foil used for Samples No. 1 and 3 had a surface roughness (Ra) of 0.2 μm. The surface roughness (Ra) of the copper foil used for Samples No. 2 and 4 was 0.5 μm. The laminate was heated at 200° C. for 120 minutes under pressure of 4 MPa to obtain a copper-clad laminate having a thickness of 0.8 mm.

Next, the copper foil was peeled off from the resulting copper-clad laminate and the organic insulating body was taken out, and dynamic mechanical analysis (DMA) was performed on the taken out organic insulating body. The prepared organic insulating body had the peak of loss tangent existing respectively at a temperature region of 100° C. or lower and a temperature region of 120° C. or higher.

The number of flame retardants and inorganic particles contained in the prepared organic insulating body 1 was examined. First, a cross-section was arbitrarily exposed from the organic insulating body. The flame retardants were then identified from the exposed cross-section using a scanning electron microscope attached with an energy dispersive X-ray analyzer, and the flame retardants and inorganic particles existing in the targeted region were respectively counted to obtain their respective number frequencies for each particle size. The area used for the measurement was 600 μm².

The individual particle size and average particle size of the flame retardant and the individual particle size and average particle size of the inorganic particles were also determined using cross-sectional photographs where the number frequencies of the flame retardant and inorganic particles were obtained. In these cases, those with a particle size of the flame retardant smaller than 0.06 μm and those with a particle size of the inorganic particles smaller than 0.04 μm were not counted because the shape of the clump contour was not clear.

The adhesion strength of the copper foil was measured using the prepared copper-clad laminates. The adhesion strength of the copper foil was measured by using an autograph to pull the copper foil in a direction perpendicular to the surface of the organic insulating body. The number of samples was five, and the average value was calculated.

The combustion test was conducted based on the UL94V combustion test method. A test piece cut out of the organic insulating body was mounted vertically on a clamp, and a flame contact was conducted with a 20 mm flame, and the time when the flame went out from the sample, which was the organic insulating body, was measured. The number of samples was five. Table 1 shows the shortest and longest times that the flame went out. The second 0 second (sec.) means that the sample was not flamed.

DESCRIPTION OF THE REFERENCE NUMERAL

A metal-clad laminate
1 organic insulating body
1a surface (of organic insulating body)
3 metal foil
3a surface (of metal foil)
5 resin phase
5a resin-exposed part
7 flame retardant
9 inorganic particle

The invention claimed is:

1. An organic insulating body comprising:
a flame retardant in a resin phase, wherein a maximum number frequency of the flame retardant is in a range of 1 μm or less when a flame retardant particle size distribution is evaluated by dividing a flame retardant particle size into 1 μm increments,
wherein a ratio of a number of flame retardant particles in the range of particle size less than 1 μm is between 45% and 60% of a total number of flame retardant particles.

2. The organic insulating body according to claim 1 further comprising inorganic particles, wherein a maximum number frequency of the inorganic particles is in a range of 0.5 μm or less when an inorganic particle size distribution is evaluated by dividing an inorganic particle size into 0.5 μm increments.

3. The organic insulating body according to claim 2, wherein an average particle size of the flame retardant is larger than an average particle size of the inorganic particles.

4. The organic insulating body according to claim 2, wherein the maximum number frequency of the flame retardant and the maximum number frequency of the inorganic particles decreases with increasing the flame retardant particle size and the inorganic particle size, respectively.

5. The organic insulating body according to claim 1, wherein the resin phase comprises cyclic olefin copolymer as a main component, and a peroxide having a benzene ring.

TABLE 1

| | Flame Retardant | | Inorganic Particles | | | Copper Foil | | Combustion Test | |
| | | | | | | | | (Combustion Time: sec) | |
| Sample No. | Particle Size Distribution (nm) | Average Particle Size (nm) | Particle Size Distribution (nm) | Average Particle Size (nm) | Tendency of Particle Size Distribution | Surface Roughness (Ra) (μm) | Adhesion Strength (kN/m) | First Time | Second Time |
|---|---|---|---|---|---|---|---|---|---|
| 1 | 80~5510 | 1100 | 40~2740 | 290 | Type 1 | 0.2 | 0.91 | 3.2~6.2 | 0~0.5 |
| 2 | 80~5510 | 1100 | 40~2740 | 290 | Type 1 | 0.5 | 1.24 | 3.2~6.2 | 0~0.5 |
| 3 | 150~6990 | 1470 | 70~3570 | 360 | Type 2 | 0.2 | 0.69 | 5.2~13.1 | 1.5~7.5 |
| 4 | 150~6990 | 1470 | 70~3570 | 360 | Type 2 | 0.5 | 0.87 | 5.2~13.1 | 1.5~7.5 |

As is clear from the results in Table 1, Sample 1 and Sample No. 2 had the adhesion strength of the copper foil of 0.91 KN/m or more, and the combustion test was 6.2 seconds or less for the first time and 0.5 seconds or less for the second time, while Sample No. 3 and Sample No. 4 had the adhesion strength of the copper foil of 0.87 KN/m or less, and the combustion test was 6.2 seconds or less for the first time and 0.5 seconds or less for the second time.

6. The organic insulating body according to claim 5, wherein the cyclic olefin copolymer comprises a thermosetting cyclic olefin copolymer, and a thermoplastic cyclic olefin copolymer.

7. A metal-clad laminate comprising the organic insulating body according to claim 1 and a metal foil laminated on at least one side of the organic insulating body.

8. A wiring board comprising a plurality of insulating layers and a metal foil disposed between the insulating layers, wherein the plurality of insulating layers are composed of the organic insulating body according to claim 1.

\* \* \* \* \*